United States Patent [19]

Otala

[11] Patent Number: 4,458,284
[45] Date of Patent: Jul. 3, 1984

[54] METHOD FOR ELECTRICAL AND THERMAL PROTECTION OF OUTPUT DEVICES OF ELECTRONIC AMPLIFIERS

[75] Inventor: Matti N. Otala, Oulu, Finland

[73] Assignee: Shin-Shirasuna Electric Corp., Nagoya, Japan

[21] Appl. No.: 374,411

[22] Filed: May 3, 1982

[30] Foreign Application Priority Data

Jun. 12, 1981 [JP] Japan .................................. 56-90261

[51] Int. Cl.³ ......................... H02H 3/28; H02H 7/20
[52] U.S. Cl. ..................................... 361/79; 361/106; 330/207 P
[58] Field of Search .................. 361/79, 78, 103, 106; 73/362 SC, 342; 307/310; 323/366; 330/298, 207 P

[56] References Cited

U.S. PATENT DOCUMENTS

| | | | |
|---|---|---|---|
| 3,792,316 | 2/1974 | Bondini et al. | 361/79 |
| 3,961,173 | 6/1976 | Perry et al. | 361/103 X |
| 4,330,809 | 5/1982 | Stanley | 361/103 |
| 4,355,341 | 10/1982 | Kaplan | 361/79 |

*Primary Examiner*—Patrick R. Salce

[57] ABSTRACT

Apparatus for electronically protecting output transistors of electronic amplifiers against thermal overload, overcurrent, overvoltage, and second breakdown mechanism. An analog multiplier circuit, together with a novel circuitry for deriving the instantaneous voltages across, and the currents through, each of the output transistors, is used to obtain the instantaneous power dissipation in the transistors. A thermal sensor, the electrical signal of which is used as an additional variable in the multiplication, yields the thermal derating necessary for the transistors, and an integrating time constant used to weigh the output signal of the multiplier, takes into account the time derating of the transistors.

5 Claims, 4 Drawing Figures

METHOD FOR ELECTRICAL AND THERMAL PROTECTION OF OUTPUT DEVICES OF ELECTRONIC AMPLIFIERS

This invention relates to an apparatus for protecting the output devices of an electronic amplifier from excess power dissipation, and more particularly it pertains to such an apparatus adapted for determining whether the allowable maximum ratings of the output devices of electronic amplifiers have been exceeded, and providing means for protecting such devices in case an overload should occur. To this end, the apparatus of this invention incorporates a combination of four-variable analog or digital multiplication; means for deriving the instantaneous voltages over, currents through, and operating temperatures of, said output devices; and means for shutting down the amplifier in case an overload should occur. In addition to these, various practical realizations and embodiments of the present invention may make additional use of other active devices, sensor elements, relays, and passivie electronic and electric components.

In the most advanced conventional installation, the momentary loading of an output device is determined employing a bridge circuit as depicted in FIG. 1 of the accompanying drawings, the operation of which is as follows: Output transistors $T_1$ and $T_2$ have as their emitter potential the instantaneous voltage across a load L. Across either one of emitter resistors $R_1$ and $R_2$ is a voltage proportional to the instantaneous output current. A weighed sum of the output voltage and the output current is sensed through resistors $R_3$ to $R_6$ and diodes $D_1$ to $D_2$ by sensing transistor $T_3$. Resistors $R_7$ and capacitor C form an integrating network to filter out possible disturbances of short duration, and to weigh the sensing according to a time constant allowable for the output transistors $T_1$ and $T_2$. The collector of the transistor $T_3$ yields an output current used to trigger a protection circuit, which shuts down the amplifier in case a predetermined level is reached.

However, the conventional circuit arrangement described just above has the following disadvantages: (1) The signal, used to determine whether the protection circuit should be triggered or not, is in proportion to the sum of the output voltage and the output current, whereas the possibility of destruction of the output transistors is proportional to the product of the output current and the voltage across the respective output device. The protection criterion in this kind of circuit is thus highly inaccurate, and based on false premises. (2) The temperature of the output devices usually has a very great influence on their possible breakdown. The temperature is not taken into consideration in such conventional circuits as shown in FIG. 1.

As a result, it has heretofore been the practice to dimension the output devices to be able to handle loads 3 to 10 times more severe than those allowable in case the protection circuit would operate according to the basic physics of the output devices.

Accordingly, it is an object to provide an apparatus arranged to circumvent the above limitations and to yield a protection signal closely corresponding to the physics of the output devices.

Other objects, features and advantages of the present invention will become apparent from the ensuing description taken in conjunction with the accompanying drawings.

According to the present invention, all the disadvantages of the above-mentioned prior art arrangement will be eliminated. The following description will be based on semiconductor devices, bipolar transistors in particular, but it will be understood that the principle described will equally be applicable to most other devices, such as field effect transistors, thermionic valves, fluidic valves and so forth.

Figure 1:
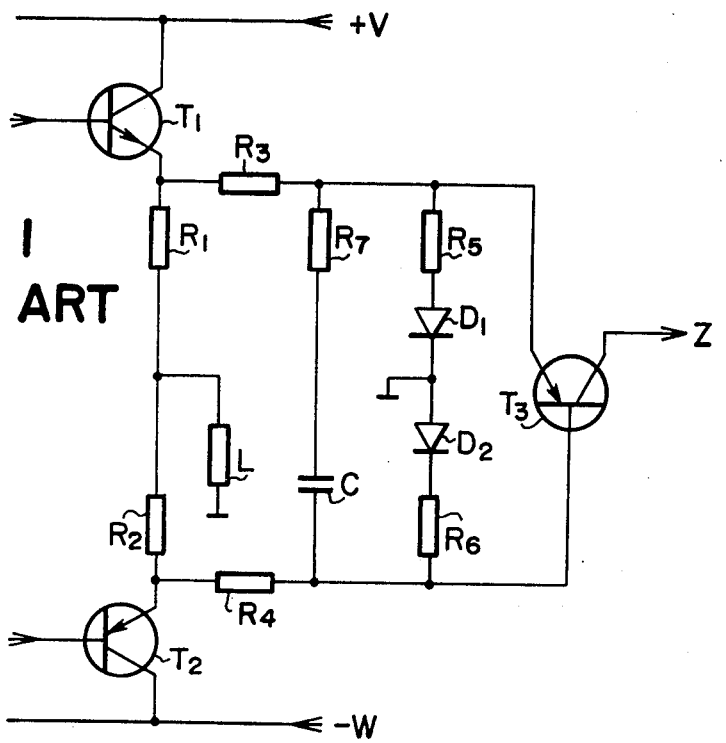
FIG. 1 is a circuit diagram illustrating prior art protection circuit as described above.
Figure 2:
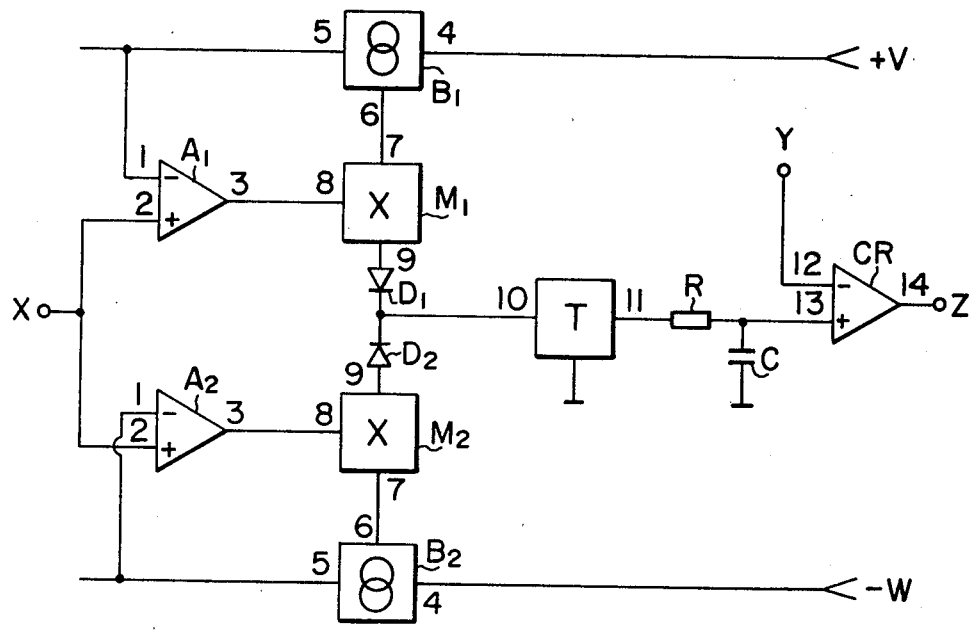
FIG. 2 is a circuit diagram showing the apparatus according to an embodiment of the present invention.

Referring to FIG. 2, the protection circuit is shown as comprising electronic amplifiers $A_1$ and $A_2$, current sources $B_1$ and $B_2$, two-variable multipliers $M_1$ and $M_2$, rectifier diodes $D_1$ and $D_2$, thermal sensor T, time constant RC, and comparator CR.

The protection circuit is connected to supply voltages $+V$ and $-W$ of the amplifier to be protected, the output signal of the amplifier being fed to the input X of the protection circuit. Differential amplifiers $A_1$ and $A_2$ yield as their output signals at their pins 3 the differences between the supply voltages and the output voltage, i.e., these signals correspond to the voltage over the output devices of the amplifier to be protected.

Current sources $B_1$ and $B_2$ sense the supply currents, producing at their output terminals 6 currents proportional to the supply currents.

Two-variable two-quadrant multipliers $M_1$ and $M_2$ multiply the output signals of $A_1$ and $B_2$, and $A_2$ and $B_2$, respectively. The output signals of the multipliers at their terminals 9 are therefore proportional to the instantaneous power dissipation of the output devices of the amplifier to be protected.

In case the output devices are identical, it suffices to detect, whether either one of them is in danger of being damaged. Therefore, the semiconductor diodes $D_1$ and $D_2$ are used to select the larger of the multiplier output signals. This is fed into thermal sensor T composed, for instance, of negative temperature coefficient resistors, and attached with good thermal contact to the output devices to be protected. The purpose of the thermal sensor T is to weigh, i.e., multiply, the output signal at pin 10 so that it inversely corresponds to the thermal derating characteristics of the output devices to be protected. This means that in the case where the output devices are cold and their overload tolerance therefore is high, the thermal sensor T has a high attenuation, whereas when the output devices are hot, it has a low attenuation for the multiplied signal.

The time derating of the multiplied signal is performed with an integrating time constant RC. This derating is based on the physical fact that the output devices may tolerate large instantaneous power dissipation peaks, whereas sustained dissipations of much lower value may severely damage them.

The multiplied and thermally and temporally weighed signal is then fed into the voltage comparator CR, which has as its other input a protection reference voltage Y. The output signal of the comparator at its output Z (pin 14) is zero, if the input at pin 13 is below the reference voltage at pin 12, and conversely attains a high value if this situation is reversed. The reference voltage at Y can now be adjusted to exactly correspond to the allowable peak power dissipation of the output devices to be protected, whereas the characteristics of the temporal and thermal weighing networks can be tailored to correspond exactly with the physical characteristics of the output devices.

The output Z of the comparator CR is used to trigger a circuit which shuts down the amplifier to be protected, or disconnects its input signal, or opens its output circuit for instance by means of an electric relay, or disconnects its supply voltages. Since there are innumerable ways and means of shutting down an amplifier, and since the principle with which the shutting is done has no bearing on the protection circuit described, this part will not be discussed in more detail here.

It will be understood that modifications and variations may be effected to the circuit described without departing from the spirit and scope of the novel concepts of the present invention.

Some of the many variations will be described below with reference to the circuit of FIG. 2.

(i) In the case of multiple amplifiers employing a common protection circuit, it suffices to duplicate the protection components up to pin 11 in FIG. 2 only, for each separate amplifier.

(ii) In the case where multiple output devices are used in the amplifier to be protected, no modifications, except changing the scale factors of the multipliers, are needed.

(iii) In the case where asymmetrical output device configurations are used in the amplifier to be protected, this may be taken into account by designing the amplifiers $A_1$ and $A_2$, or the current sources $B_1$ and $B_2$, to have different gains.

(iv) Instead of two-variable multipliers $M_1$ and $M_2$, multi-variable multipliers may be used with the thermal and temporal derating signals being applied as additional inputs to the multi-variable multiplier(s).

(v) Instead of being constant, the protection reference voltage Y may be made variable, e.g., dependent on the type or composition of the signal to be amplified, or on the characteristics of the load of the amplifier to be protected, thus yielding even more economical amplifier designs.

Figure 3:
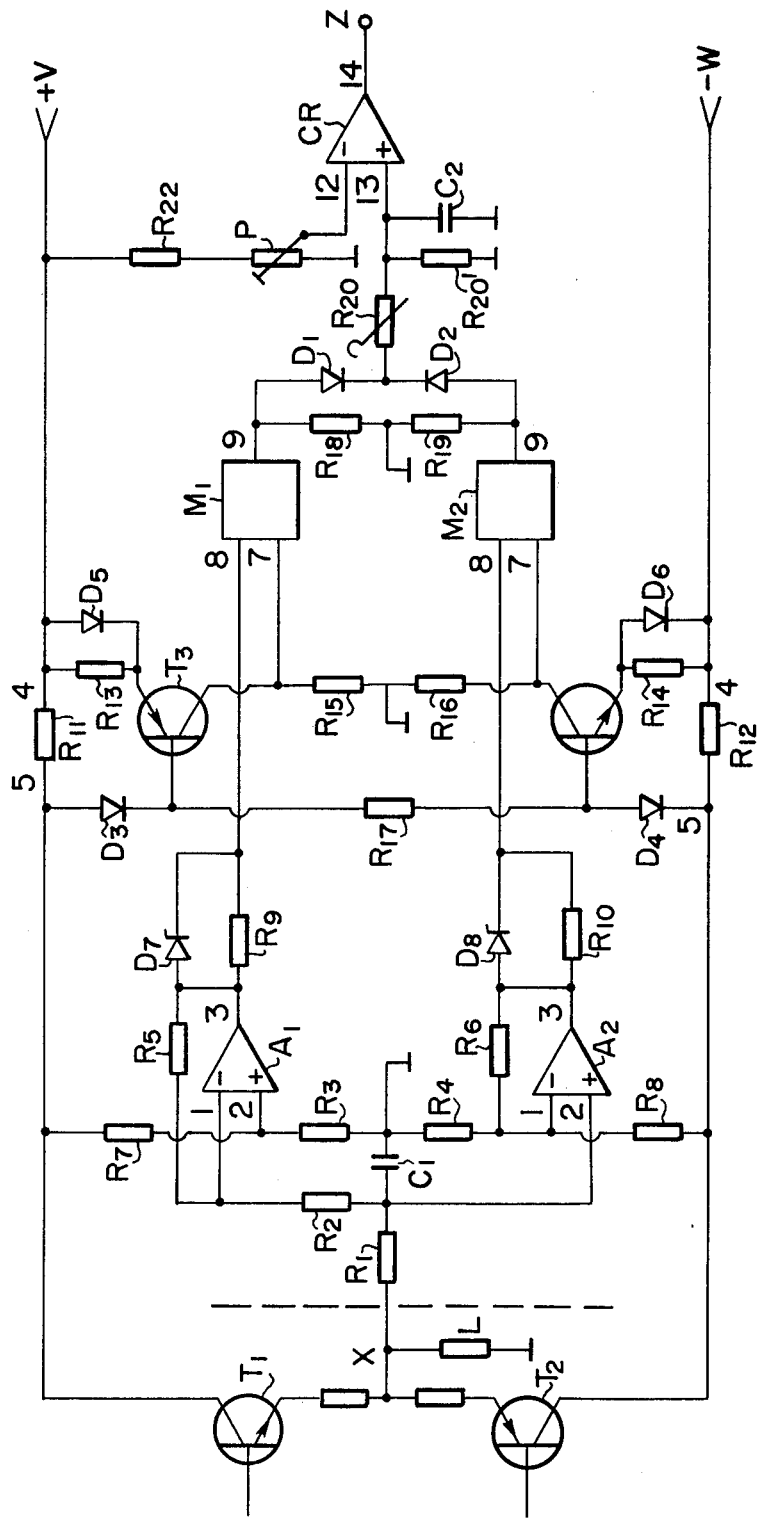
FIG. 3 is a circuit diagram showing in greater detail the circuit arrangement of the apparatus shown in FIG. 2.

FIG. 3 shows, by way of example, one of the many possible practical embodiments of the present invention. The basic functions are analogous to those of the circuit shown in FIG. 2. Amplifiers $A_1$ and $A_2$ are standard operational amplifiers, such as the commercially available type LM 324. Resistors $R_1$ through $R_8$ attenuate the supply voltages $+V$ and $-W$ and the output voltage X to a level tolerable to the operational amplifiers. The resistors $R_1$ through $R_8$ are dimensioned so that the output signals of $A_1$ and $A_2$ at their terminals 3 are proportional to the voltages over the output transistor $T_1$ and $T_2$ to be protected.

The currents through the transistors $T_1$ and $T_2$ cause a voltage drop across small resistors $T_{11}$ and $R_{12}$. These voltage drops are amplified and translated into corresponding voltages across resistors $R_{15}$ and $R_{16}$ by circuits incorporating bipolar transistors $T_3$ and $T_4$, semiconductor diodes $D_3$ through $D_6$, and resistors $R_{13}$ through $R_{17}$. In this circuit, the semiconductor diodes $D_3$ and $D_4$ compensate for the voltage drop across the base to emitter junctions of the transistors $T_3$ and $T_4$, whereas semiconductor diodes $D_5$ and $D_6$ cause a rapid increase in the voltage over the resistors $R_{15}$ and $R_{16}$ if the current through resistors $R_{11}$ and $R_{12}$ is such as to cause the diodes $D_5$ and $D_6$ to conduct. This effect is used to establish a limit for the maximum current which can flow through the output transistors $T_1$ and $T_2$.

Four-quadrant multipliers, such as the operational transconductance amplifier of type CA 3060 are used as multipliers $M_1$ and $M_2$, and the products of the voltages and currents of the output devices or transistors $T_1$ and $T_2$ appear across resistors $R_{18}$ and $R_{19}$.

Semiconductor diodes $D_1$ and $D_2$ select the larger of the products, which is subsequently weighed thermally with a circuit formed by negative temperature coefficient resistor $R_{20}$ and resistor $R_{21}$, and weighed temporally with time constant $R_{21}C_2$. The resultant signal is sensed with comparator CR, which can be any of the large variety of commercially available comparator circuit. The comparator compares the signal with the protection threshold voltage set with the aid of a potentiometer P.

Figure 4:
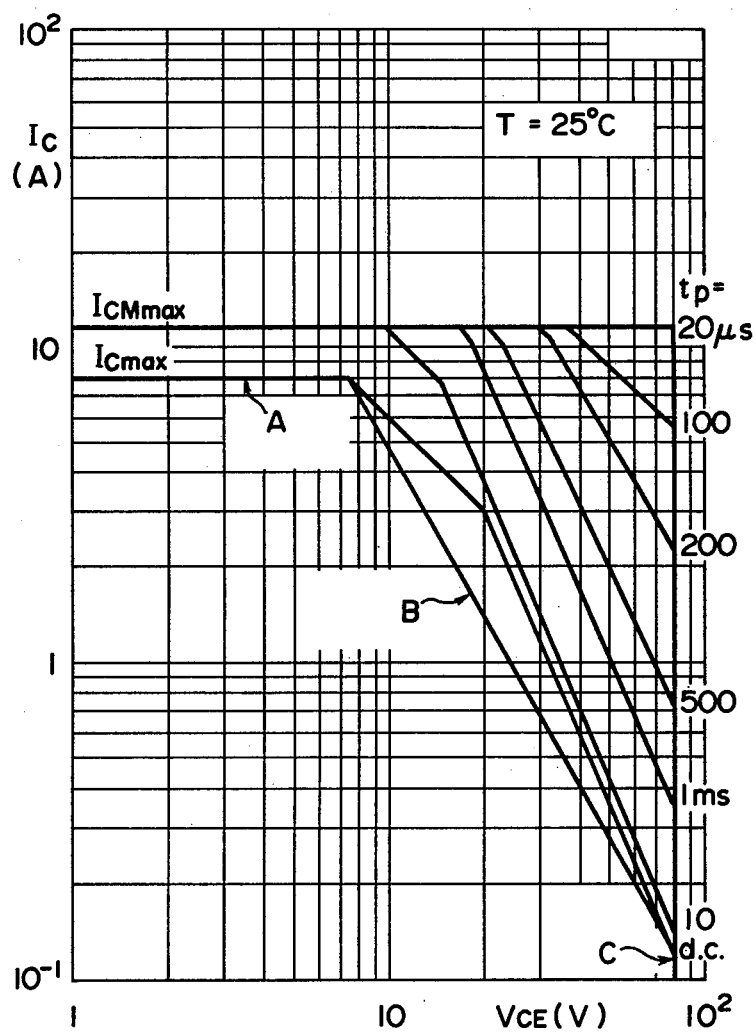
FIG. 4 is a view showing, as an example, the way how to adjust the described circuit to the allowable maximum rating specification of a bipolar output device.

FIG. 4 shows a typical plot of the safe operating area (SOA) of an output transistor. These plots are routinely published by the manufactures for all and every output device. The plot indicates the maximum allowable combinations of the voltage across, i.e. $V_{CE}$, and the current through, i.e. $I_C$, the transistor, with duration, i.e. $t_p$, of the current pulse as a parameter.

The circuit of FIG. 3 is designed and adjusted to protect an output device as characterized by FIG. 4 as follows: (i) Resistors $R_{11}$ and $R_{12}$ are dimensioned so as to cause diodes $D_5$ and $D_6$ to start conducting if the maximum allowable current $I_{Cmax}$, as shown in FIG. 4, is exceeded. This causes the above-described protection circuit to be triggered irrespective of the voltage across the output transistors $T_1$ and $T_2$, and the protection characteristic therefore corresponds to section A in FIG. 4. (ii) Section B in FIG. 4 is obtained by dimensioning resistors $R_1$ through $R_{10}$ and $R_{13}$ through $R_{16}$ so that the protection circuit is triggered if the straight-line approximation B is exceeded. (iii) The breakdown voltage of the semiconductor Zener-effect diodes $D_7$ and $D_8$ is selected so as to make them conduct should the maximum collector to emitter voltage $V_{CE}$ over the output transistors $T_1$ and $T_2$ be exceeded. This corresponds to section C in FIG. 4. (iv) The time constant $R_{21}C_2$ is dimensioned so as to correspond to the temporal derating indicated in FIg. 4 for various power dissipations of shorter duration. (v) The negative temperature coefficient resistor $R_{20}$ is dimensioned so as to follow the separate temperature derating recommendations given by the manufacturer for the output transistors $T_1$ and $T_2$.

It is to be understood that in a similar manner the various components of the protection circuit of FIG. 3 can be designed and dimensioned to protect any and all output device type and designations.

What is claimed is:

1. An apparatus for protecting the output devices of an electronic amplifier having means for connecting a signal, load or supply voltge to said amplifier, from excess power dissipation, comprising:
   means adapted to yield instantaneous voltages across said output devices;
   means adapted to yield instantaneous currents through said output devices;
   means for multiplying said voltages and currents into a signal product;

means including a temperature-sensitive element for thermal weighing said multiplied signal products;

means for temporal weighing of said multiplied signal products;

means for comparing said thermally and temporally weighed multiplied signal products with an adjustable protection reference; and means for activating a member to disconnect said connecting means from said amplifier to be protected.

2. An apparatus according to claim 1, wherein said means adapted to yield the instantaneous voltages across said output devices includes means for detection of overvoltage across said output devices.

3. An apparatus according to claim 1, wherein said means adapted to yield the instantaneous currents through said output devices includes means for detection of overcurrent through said output devices.

4. An apparatus according to claim 1, wherein said protection reference is made dependent on signal or load characteristics, or both, of said amplifier, to render variable said protection reference.

5. An apparatus according to claim 1, further comprising means for selecting the largest of two or more of said multiplied signal products to render said member operative to disconnect said connection means when the largest of two or more of said multiplied products exceeds said protection reference.

* * * * *